United States Patent [19]
Abolafia et al.

[11] 4,160,691
[45] Jul. 10, 1979

[54] ETCH PROCESS FOR CHROMIUM

[75] Inventors: Oscar R. Abolafia, Endwell; John Rasile, Endicott, both of N.Y.

[73] Assignee: International Business Machines Corporation, Armonk, N.Y.

[21] Appl. No.: 859,073

[22] Filed: Dec. 9, 1977

[51] Int. Cl.² .............................................. C23F 1/00
[52] U.S. Cl. .................................... 156/664; 156/656; 156/659; 252/79.4
[58] Field of Search ............................... 427/101–103; 252/79.4; 156/656, 659, 664; 338/308, 314; 29/610, 620

[56] References Cited

U.S. PATENT DOCUMENTS 2,230,156  12/1978  Carman .............................. 252/79.4
2,687,345  8/1954   Murray .............................. 252/79.4

Primary Examiner—William A. Powell
Attorney, Agent, or Firm—David M. Bunnell

[57] ABSTRACT

Chromium/copper/chromium conductor lines and glass-chromium cermet resistor structures are formed on a substrate by a subtractive etch process in which undercutting of the top chromium layer and changes in the resistivity of the cermet are minimized by etching the chromium with a mixture of a low concentration (about 5 to 20% by volume) of concentrated (37%) HCl in about 65 to 95% by volume of an aliphatic alcohol such as glycerine with the remainder, if any, to make 100% being water at an elevated temperature of from about 50° to 95° C.

10 Claims, No Drawings

ETCH PROCESS FOR CHROMIUM

BACKGROUND OF THE INVENTION

Substrates for mounting and electrically interconnecting integrated circuit chips are formed by depositing blanket layers of chromium-glass cermet resistor material, chromium, copper, and chromium in sequence upon a ceramic substrate and subtractively etching any portions of the layers through overlying resist masks in order to form a structure of conductor lines and cermet resistors. In the past, chromium has been etched using mixtures of NaOH and $KMnO_4$. This mixture, however, attacks the chromium in the cermet and changes its resistivity. Also, such mixtures attack positive resists of the phenol-formaldehyde novolak resin type so it is necessary to use negative resists. It is known to etch chromium in HCl-water mixtures but this is found to be effective only where chromium is in contact with copper. Therefore, after the edges of the lower chromium layer which are in contact with the copper are etched away, a residual island of chromium remains in the center. In U.S. Pat. No. 2,230,156, a process for etching chromium in contact with copper for lithographic plates is disclosed which uses mixtures of one volume of aqueous 37% HCl with 3 to 6 volumes of a glycol containing more carbon atoms than hydroxyl groups. U.S. Pat. No. 2,687,345 discloses the etching of chromium in bimetal lithographic plates using mixtures of HCl and polyhydric alcohols containing CaCl to reduce the attack on the resist layer during the etching process and provide a faster etch rate.

It has been found that, although mixtures of glycols and dilute HCl will etch the chromium at ambient temperatures, when etching the lower chromium layer the exposed edges of the top chromium layer etch during the relatively longer times needed to etch the lower layer so that undercutting of the top layer occurs. The result is that a portion of the copper is exposed at the top edges and ends of the conductor lines. When the structure is tinned, the copper is wetted by the solder in these exposed areas and solder bridges over the resistors and between the conductor lines can form which render the structure inoperative. A concentrated HCl mixture of 50% by volume or more has been found to provide an etch time for the lower chromium layer which sufficiently minimizes the undercutting of the top chromium layer, however, these concentrated acid mixtures attack the cermet and cause unacceptable changes in its resistivity. Surprisingly, we have found that by using dilute HCl and water miscible organic solvent mixtures at an elevated temperature, both undercutting of the top chromium layer and changes in cermet resistivity are kept to acceptable amounts while achieving a satisfactory etch rate of chromium.

BRIEF SUMMARY OF THE INVENTION

In accordance with this invention there is provided a process for etching chromium comprising contacting the chromium with a mixture comprising from about 5 to 20% by volume of concentrated HCl and about 65 to 95% by volume of a water miscible organic solvent with the remainder, if any, water at a temperature of from about 50° to 95° C. The etching process permits the formation of chromium/copper/chromium conductor lines and glass-chromium cermet resistor structures on an insulating substrate by a subtractive etch process in which the etching of copper, the undercutting of the top chromium layer and changes in the resistivity of the cermet are minimized.

DETAILED DESCRIPTION

The etching solutions useful in the process of the invention contain HCl, water and an organic solvent which is miscible with water, for example aliphatic alcohols and esters such as cellulose acetate. Especially effective are mono, di or trihydroxy aliphatic alcohols which are miscible with water such as glycerine, ethylene glycol, propylene glycol, diethylene glycol and carbitol which have low volatitity at the etching temperatures. Polyhydric alcohols having boiling points in the range of about 190° to 300° C. are preferred.

A suitable etching composition for the process of the invention can be prepared by mixing from about 65 to 95% by volume of aliphatic alcohol with 5 to 20% by volume concentrated HCl, (by concentrated HCl throughout the specification and claims is meant the 37% by volume or 11.5-12 normal aqueous reagent). Additional deionized water (0 to 30% by volume) can be added. The added water is used to adjust the etchant solution viscosity to a level needed for any particular application.

The etching temperatures are adjusted to give suitable etch times. In the case of etching the bottom chromium layer of the chromium/copper/chromium composite metallurgy the temperature is chosen to give etch times between the top and bottom chromium layers which are typically within 20% of being equal or, at most, not more than about twice as long for the bottom chromium layer. This minimizes the undercutting of the top chromium layer while etching the lower chromium so that copper is exposed to a negligible extent. Suitable etching temperatures range from about 50° to 95° C. with a preferred range being from about 65° to 75° C. These give etch times for 800 Å chromium layers of about 25 to 45 seconds for the top chromium layer and 15 to 90 seconds for the bottom chromium layer.

The process of the invention is further illustrated by, but is not intended to be limited to the following examples.

EXAMPLE I

The process of the invention is employed to prepare a chromium/copper/chromium conductor line and chromium-silicon oxide cermet resistor structure on a substrate. The starting structure is a ceramic substrate blanket coated with a 1500 Å thick layer of a cermet composition of 62% chromium and 38% silicon oxide followed in order by an 800 Å thick chromium layer, a 8 microns thick copper layer and a top layer of 800 Å thick chromium. A negative photoresist (KTFR resist marketed by Kodak) is coated to a thickness of about 4 to 5 microns on top of the structure, exposed and developed conventionally to uncover the desired cermet resistor pad area portions. The structure is then immersed in a chromium etchant bath containing 75% by volume glycerine, 12.5% by volume concentrated HCl and 12.5% by volume of deionized water at an etching temperature of 70° C. The top chromium layer is etched in about 30 seconds. The structure is then rinsed in deionized water and immersed in a ferric chloride etchant bath to remove the copper layer in the exposed areas. The structure is then rinsed in deionized water and again placed in the same chromium etchant bath to remove the bottom chromium layer and expose the cermet in the pad areas. The etching time to remove the 800 Å thick bottom chromium layer is about 30 seconds. The KTFR resist is stripped and the structure is recoated with a fresh layer of KTFR resist which is exposed and developed to provide a pattern for the desired conductor line network to the resistor pads. The chromium/copper/chromium layers are removed in the exposed areas using the same chromium and copper etch process which is described above to uncover the resistor pads. The background cermet in the non-resistor pad areas between the conductor lines is then removed by a RF reactive gas plasma etching process. The remaining resist layer is stripped and a third photolithographic process is performed using KTFR resist to uncover a pattern from which the top chrome layer is removed to provide exposed copper pads for subsequent solder tinning. The exposed portions of the top chromium layer are then removed by the chrome etch process described above and the resist layer is removed. The resulting structure of chromium/copper/chromium conductor lines and chromium-silicon oxide cermet resistors on the ceramic substrate is now ready for a solder tinning operation in preparation for mounting semiconductor chips. Although, the same chromium etch solution is used for both the top and bottom chrome layers in this example it is the bottom chromium etch which is critical in avoiding the undercutting problem. Therefore, the top chrome layer can be etched by any solution which does not have an adverse effect on the resist layer or on the cermet resistivity such as aqueous-HCl water mixtures or aqueous HCl and aliphatic alcohol mixtures under temperature conditions and concentrations which are outside of the conditions which are critical to minimize the undercutting in achieving the required relative etch time when etching the bottom chromium layer.

EXAMPLE II

A series of experiments were conducted to determine if a composition of hydrochloric acid and glycerine could be effectively used at room temperature to etch both layers of chromium in a chromium/copper/chromium metallurgy structure at a sufficiently equal etch rate to minimize the undercutting. From this series of experiments it was found that a 50% or greater volume concentration of concentrated 37% HCl and glycerine provides a suitable etch rate. A series of experiments were conducted to determine if such a solution could be used without any deleterious effects on the cermet material. For this purpose, another series of experiments were performed in which ceramic substrates with chromium/copper/chromium layers over a layer of 62% chromium and 38% silicon oxide cermet material as described in Example I were first masked so that half of each sample was covered with resist and the unmasked half was etched, under the conditions described in Example I, to remove the top metallurgy layers and expose the cermet thin film resistor material. The resistivity of the uncovered cermet thin film of each sample part was measured. The parts were then submerged in hydrochloric acid-glycerine solutions of different concentrations at room temperature for times corresponding to about twice the etch times for chromium at that concentration. The reason for choosing this time period was that this would be the expected worse case condition of exposure of the cermet to the chromium etchant solution under manufacturing conditions. The results showed that there was a significant increase in resistivity of the cermet after the specified period of immersion in the solutions having a 50% by volume HCl or greater concentration. The change in resistivity was found to be 10% for the 50% by volume HCl and glycerine solution and the change increased as the concentration of hydrochloric acid was increased. The corresponding immersion time was 6 minutes.

EXAMPLE III

In order to illustrate other low concentration HCl/glycerine etchant solutions and temperatures which are useful in the process of the invention to provide nearly equal etch rates in order to minimize undercutting without affecting the cermet resistivity, chromium/copper/chromium layers over a ceramic substrate as described in Example I were etched using etchant solutions for chromium at the concentrations and temperatures shown in Table I below.

TABLE I

| Quantity of Conc. HCl in Glycerine, % by Volume | Operating Etch Temp. °C. | Range of Etch Times in Seconds |
|---|---|---|
| 5 | 94 | 15–25 |
| 10 | 71 | 30–45 |
| 15 | 60 | 60–90 |
| 20 | 52 | 80–120 |

In each case, the use of elevated temperatures and concentrations of HCl within the range of the Applicants' process resulted in negligible changes in the resistivity of the cermet film (less than 1%) after immersion times of twice the etch time. The range of etching times is given in the Table for top and bottom chromium layers which were 800 Å thick. The solutions were prepared by mixing the concentrated, 37% by volume, HCl reagent with glycerine without added water.

The above process provides a way of etching chromium layers which can use relatively dilute hydrochloric acid solutions and achieve a satisfactory etch rate by employing elevated temperatures. Chromium/copper/chromium layers over cermet can be etched with less than a 1% change in cermet film resistivity. Etch times for the bottom chrome layer are such that undercutting of the top chromium layer is minimized so that copper is not exposed along the ends and edges of the conductor lines to an extent that bridging between the lines or over resistor structures occurs when the structure is solder tinned. While the process has been described with respect to preferred embodiments thereof, it should be understood by one skilled in the art that the foregoing and other changes in form and details may be made therein without departing from the spirit and scope of the invention.

What is claimed is:

1. A process for etching chromium comprising contacting the chromium with a mixture comprising from about 5 to 20% by volume of concentrated HCl, from about 65 to 95% by volume of a water miscible organic solvent and from about 0 to 30% by volume water at a temperature of from about 50° to 95° C.

2. The process of claim 1 wherein the organic solvent is an aliphatic alcohol having a boiling point in the range of about 190° to 300° C.

3. The process of claim 1 wherein the mixture comprises about 75% by volume glycerine, about 12.5% by volume concentrated HCl and about 12.5% by volume deionized water and the etching temperature is about 70° C.

4. The process of claim 2 wherein the aliphatic alcohol is a polyhydric alcohol.

5. The process of claim 1 wherein the etching temperature ranges from about 65° to 75° C.

6. A process for selectively etching a chromium layer from a layer of chromium containing cermet comprising contacting the chromium layer with a mixture comprising from about 5 to 20% by volume of concentrated HCl, from about 65 to 95% by volume of a water miscible organic solvent and from about 0 to 30% by volume water at a temperature of from about 50° to 95° C.

7. The process of claim 6 wherein the cermet contains silicon oxide and chromium.

8. In a process for forming a chromium/copper/chromium conductor line and a glass-chromium cermet resistor structure on an insulating substrate in which successive layers of cermet, chromium, copper and chromium are formed on an insulating substrate and portions of the layers are removed by selective etching through patterned resist masks, the improvement which comprises etching the bottom chromium layer by contacting said layer with a mixture comprising from about 5 to 20% by volume of concentrated hydrochloric acid, about 65 to 95% by volume of a water miscible aliphatic alcohol having a boiling point in the range of about 190° to 300° C. and from about 0 to 30% by volume of water at a temperature of from about 50° to 95° C. whereby the undercutting of the top chromium layer and changes in the resistivity of the cermet are minimized.

9. The process of claim 8 wherein the etching temperature ranges from about 65° to 75° C.

10. The process of claim 8 wherein the etching solution comprises about 75% by volume glycerine, about 12.5% by volume concentrated HCl and about 12.5% by volume water and the etching temperature is 70° C.

* * * * *